US009455707B2

(12) United States Patent
Herr et al.

(10) Patent No.: US 9,455,707 B2
(45) Date of Patent: Sep. 27, 2016

(54) SUPERCONDUCTIVE GATE SYSTEM

(71) Applicants: Anna Y. Herr, Ellicott City, MD (US); Quentin P. Herr, Ellicott City, MD (US)

(72) Inventors: Anna Y. Herr, Ellicott City, MD (US); Quentin P. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 87 days.

(21) Appl. No.: 14/325,518

(22) Filed: Jul. 8, 2014

(65) Prior Publication Data
US 2016/0013791 A1    Jan. 14, 2016

(51) Int. Cl.
*H03K 19/00* (2006.01)
*H03K 19/195* (2006.01)
*G11C 11/44* (2006.01)
*H03K 3/38* (2006.01)
*B82Y 10/00* (2011.01)

(52) U.S. Cl.
CPC ......... *H03K 19/0008* (2013.01); *G11C 11/44* (2013.01); *H03K 3/38* (2013.01); *H03K 19/1952* (2013.01); *B82Y 10/00* (2013.01)

(58) Field of Classification Search
CPC ............... G01R 33/3815; G01R 33/34023; G01R 33/035; G01R 33/0354; G06N 99/002; B82Y 10/00; H01F 6/008; H01F 6/00; H01F 41/048; H01F 6/003; H03K 19/195; H03K 3/38; H03K 17/92; H01L 39/223; H01L 39/2493; H01L 39/22; H01L 49/006; H01L 39/025; H01L 39/16; H01L 39/045; Y10T 29/49014

USPC ............... 326/1-7; 327/366-373, 527-529; 505/162, 164, 170, 204; 361/141; 716/30, 103
See application file for complete search history.

(56) References Cited

U.S. PATENT DOCUMENTS

| 4,501,975 | A | 2/1985 | Josephs et al. |
| 5,150,326 | A | 9/1992 | Aoki |
| 7,724,020 | B2 | 5/2010 | Herr |
| 7,786,748 | B1 | 8/2010 | Herr |
| 7,977,964 | B2 | 7/2011 | Herr |
| 8,489,163 | B2 | 7/2013 | Herr et al. |
| 2004/0201400 | A1* | 10/2004 | Herr .................................. 326/3 |
| 2013/0040818 | A1* | 2/2013 | Herr et al. .................... 505/190 |

OTHER PUBLICATIONS

Likharev, et al. "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991, pp. 3-28.*

(Continued)

*Primary Examiner* — Alexander H Taningco
*Assistant Examiner* — Seokjin Kim
(74) *Attorney, Agent, or Firm* — Tarolli, Sundheim, Covell & Tummino LLP

(57) ABSTRACT

One embodiment includes a superconductive gate system. The superconductive gate system includes a Josephson D-gate circuit comprising a bi-stable loop configured to store a digital state as one of a first data state and a second data state in response to an enable single flux quantum (SFQ) pulse provided on an enable input and a respective presence of or absence of a data SFQ pulse provided on a data input. The digital state can be provided at an output. The readout circuit is coupled to the output and can be configured to reproduce the digital state as an output signal.

20 Claims, 10 Drawing Sheets

(56) References Cited

OTHER PUBLICATIONS

International Search Report mailed Apr. 14, 2015, Completed by the European Patent Office on Apr. 7, 2015.

Jones, H. C., and T. R. Gheewala. "AC powered Josephson latch circuits." *Solid-State Circuits, IEEE Journal of* 17.6 (1982): 1201-1210.

Yamada, Toshishige, and Jun'ichi Sone. "Current-injection Josephson latch employing a single-flux quantum. II." *Journal of applied physics* 59.9 (1986): 3202-3207.

Likharev, K.K., and V.K. Semenov. "RSFQ Logic/ Memory Family: A New Josephson-Junction Technology for Sub-Terahertz-Clock-Frequency Digital Systems." *Applied Superconductivity, IEEE Transactions on 1* No. 1 (1991): 3-28.

Nagasawa, Shuichi, Haruhiro Hasegawa, Tatsunori Hashimoto, Hideo Suzuki, Kazunori Miyahara, and Youichi Enomoto. "Superconducting latching/SFQ hybrid RAM," *Applied Superconductivity, IEEE Transactions on* 11, No. 1 (2001): 533-536.

* cited by examiner

US 9,455,707 B2

SUPERCONDUCTIVE GATE SYSTEM

This invention was made with Government support under Contract No. N66001-12-C-2018. The Government has certain rights in this invention.

TECHNICAL FIELD

The present invention relates generally to quantum and classical digital superconducting circuits, and specifically to a superconductive gate system.

BACKGROUND

In the field of digital logic, extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nW (nanowatts), at a typical data rate of 20 Gb/s (gigabytes/second), or greater, and operating temperatures of around 4° Kelvin.

SUMMARY

One embodiment includes a superconductive gate system. The superconductive gate system includes a Josephson D-gate circuit comprising a bi-stable loop configured to store a digital state as one of a first data state and a second data state in response to an enable single flux quantum (SFQ) pulse provided on an enable input and a respective presence of or absence of a data SFQ pulse provided on a data input. The digital state can be provided at an output. The readout circuit is coupled to the output and can be configured to reproduce the digital state as an output signal.

Another embodiment includes a method for writing a digital state into a memory cell. The method includes generating an enable SFQ pulse to enable a write operation to the memory cell. The method also includes providing an enable SFQ pulse on an enable input of a Josephson D-gate circuit associated with the memory cell, the Josephson D-gate circuit comprising a bi-stable loop having a bi-stable current. The method further includes either providing a data SFQ pulse on a data input of the Josephson D-gate circuit to set the bi-stable current in a first direction associated with a first data state in response to the enable SFQ pulse or not providing the data SFQ pulse on the data input of the Josephson D-gate circuit to set the bi-stable current in a second direction opposite the first direction associated with a second data state in response to the enable SFQ pulse.

Another embodiment includes a superconductive memory system comprising a plurality of memory cells arranged in an array of rows and columns. Each of the plurality of memory cells includes a first interconnect that couples a word-line associated with a given one of the rows to an enable input of the respective one of the plurality of memory cells. The first interconnect can be configured to provide an enable SFQ pulse on the enable input. Each of the plurality of memory cells also includes a second interconnect that couples a bit-line associated with the given one of the columns to a data input of the respective one of the plurality of memory cells. The second interconnect can be configured to provide a data SFQ pulse on the data input. Each of the plurality of memory cells further includes a Josephson D-gate circuit comprising a bi-stable loop configured to store a digital state as one of a first data state and a second data state in response to the enable SFQ pulse and one of a presence of and an absence of the data SFQ pulse, respectively.

DETAILED DESCRIPTION

Figure 1:
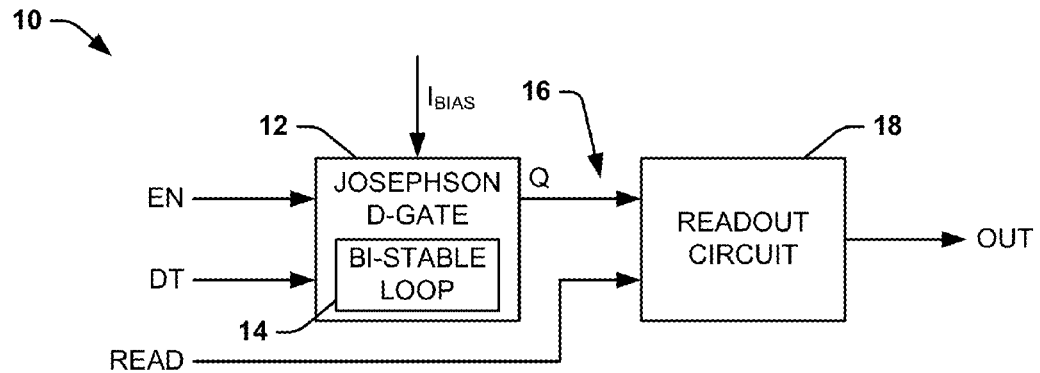
FIG. 1 illustrates an example of a superconductive gate system.

The present invention relates generally to quantum and classical digital superconducting circuits, and specifically to a superconductive gate system. Reciprocal quantum logic (RQL) is a new development in superconducting logic circuits that utilizes reciprocal data encoding in which logic operations are completed using positive pulses, while the internal state is erased using corresponding negative pulses that come half a clock cycle later, to produce combinational logic behavior. Examples of RQL logic operations are disclosed in U.S. Pat. Nos. 7,724,020 and 7,977,964 both entitled "Single Flux Quantum Circuits", the entire contents of both being incorporated by reference herein.

A superconductive gate system can include a Josephson D-gate circuit that includes a bi-stable loop configured to store a digital state corresponding to a first data state (e.g., logic 0) or a second data state (e.g., logic 1) and which implements an RQL architecture. As an example, the bi-stable loop can store the digital state based on a direction of a bi-stable current corresponding to a superconducting phase of one of a plurality (e.g., pair) of the Josephson junctions that constitute the bi-stable loop. The digital state can be written to the Josephson D-gate circuit based on an enable SFQ pulse that is provided on an enable input and the presence of or absence of a data SFQ pulse that is provided on a data input. For example, the absence of the data SFQ pulse can correspond to a first data state (e.g., logic 0) and the presence of the data SFQ pulse can correspond to a second data state (e.g., logic 1). In response to the enable SFQ pulse and/or the data SFQ pulse, a plurality of the Josephson junctions in the Josephson D-gate circuit can sequentially trigger to switch the current direction of the bi-stable current from a first direction at the beginning of a write operation to either the first direction or a second direction at the end of the write operation. Accordingly, the digital state can be stored therein. The superconductive gate system can also include a readout circuit coupled to the output and being configured to reproduce the digital state as an output signal. In this implementation, power is only dissipated during set, reset, and read operations, and there is no power dissipation in the hold state.

As an example, the superconductive gate system can be implemented in a memory cell, such as part of a superconductive memory system. The superconductive memory system can include the superconductive gate system, and can further include a first interconnect and a second interconnect. The first interconnect can couple the enable input to a word-line and can be configured to convey a word-write signal on the word-line to the enable input in the form of an SFQ pulse. As an example, the word-line can be coupled to each of a plurality of memory cells in a row of an array of memory cells. The second interconnect can couple the data input to a bit-line and can be configured to convey a bit-write signal on the bit-line to the data SFQ pulse. As an example, the bit-line can be coupled to each of a plurality of memory cells in a column of an array of the memory cells. Thus, the superconductive gate systems can operate as a memory array to store selectable words of data.

FIG. 1 illustrates an example of a superconductive gate system 10. The superconductive gate system 10 includes a Josephson D-gate circuit 12 that implements a bi-stable loop 14. The bi-stable loop 14 can store a digital state based on a bi-stable current direction therein. For example, the bi-stable loop 14 can conduct a first bi-stable current (e.g., $-\Phi/2$) that corresponds to a first superconducting phase of a Josephson junction, and is thus associated with a first data state of the digital state, and can conduct a second bi-stable current (e.g., $\Phi/2$) that corresponds to a second superconducting phase of the Josephson junction, and is thus associated with a second data state of the digital state. Both the first and second bi-stable currents can be produced by a DC flux bias generated from a flux bias winding (e.g., inductor) coupled to the bi-stable loop in an RQL configuration. It is to be appreciated that a variety of other circuit configurations could be employed to bias the bi-stable loop to produce the first and second bi-stable currents. The first bi-stable current and the second bi-stable current can be substantially equal and flow in opposite directions with respect to each other. It is further to be appreciated that a winding can simply be inductance in a transmission line or some other superconducting structure and not necessarily an actual wound superconductor wire.

In the example of FIG. 1, the Josephson D-gate circuit 12 can receive an enable signal EN, such as at an enable input, and a data signal DT, such as at a data input. As an example, the enable signal EN and the data signal DT can each have a first binary state corresponding to the presence of a single flux quantum (SFQ) pulse and a second binary state corresponding to the absence of an SFQ pulse. For example, the enable signal EN and the data signal DT can be generated by interconnects based on word-write signals and bit-write signals that are generated in a memory system that includes the superconductive gate system 10. The enable signal EN can thus enable a write operation to the superconductive gate system 10 for the storage of the digital state, and the data signal DT can correspond to the digital state based on the presence of or absence of the data SFQ pulse. For example, the absence of the data SFQ pulse can correspond to a first data state (e.g., logic 0) and the presence of the data SFQ pulse can correspond to a second data state (e.g., logic 1). In response to the enable SFQ pulse and/or the data SFQ pulse, a plurality of the Josephson junctions in the Josephson D-gate circuit 12 can sequentially trigger to switch the current direction of the bi-stable current from a first direction at the beginning of the write operation to either the first direction or a second direction at the end of the write operation. Accordingly, the digital state can be stored therein, such as based on a superconducting phase of a Josephson junction that constitutes a portion of the bi-stable loop 14.

In the example of FIG. 1, the digital state is represented by a signal Q at an output 16, and which thus corresponds to either the first data state or the second data state. As an example, the output 16 can be configured as a Josephson transmission line (JTL), and can thus be formed of one or more Josephson junction and inductor superconducting loops. The superconductive gate system 10 also includes a readout circuit 18 coupled to the output 16. The readout circuit 18 is configured to reproduce the digital state as an output signal OUT in response to a read signal, demonstrated in the example of FIG. 1 as a signal READ that is provided to the readout circuit 18. For example, the readout circuit 18 can be configured as an AND-gate or an A-AND-NOT-B gate that is configured to non-destructively read the digital state of the Josephson D-gate circuit 12 in response to the read signal READ. Accordingly, the output signal OUT can be received by a variety of other circuit devices/components to determine the digital state that is stored in the Josephson D-gate circuit 12. As an example, the superconductive gate system 10 can be implemented in one of a plurality of memory cells, such as in a memory system, to store data in rows of data words.

Figure 2:
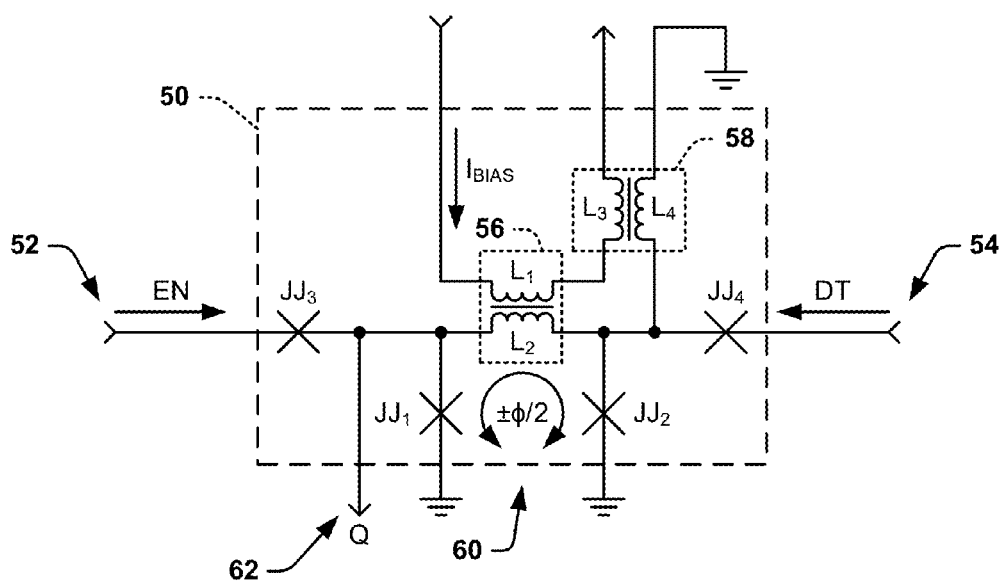
FIG. 2 illustrates an example of a Josephson D-gate circuit.

FIG. 2 illustrates an example of a Josephson D-gate circuit 50. The Josephson D-gate circuit 50 can correspond to the Josephson D-gate circuit 12 in the example of FIG. 1. Thus, reference is to be made to the example of FIG. 1 in the following description of the example of FIG. 2.

The Josephson D-gate circuit 50 includes an enable input 52 on which the enable signal EN is provided and a data input 54 on which the data signal DT is provided. The Josephson D-gate circuit 50 also includes a first transformer 56 that includes a first inductor $L_1$ at a primary and a second inductor $L_2$ at a secondary, as well as a second transformer 58 that includes a first inductor $L_3$ at a primary and a second inductor $L_4$ at a secondary. A bias current $I_{BIAS}$ is provided through the inductors $L_1$ and $L_3$ to induce a bias current in the inductors $L_2$ and $L_4$ to implement an RQL architecture. The Josephson D-gate circuit 50 also includes a bi-stable loop 60 that is formed by a first Josephson junction $JJ_1$, a second Josephson junction $JJ_2$, and the inductor $L_2$. The Josephson-D gate 50 also includes a third Josephson junction $JJ_3$ interconnecting the enable input 52 and the bi-stable loop 60, and a fourth Josephson junction $JJ_4$ interconnecting the data input 54 and the bi-stable loop 60.

In the example of FIG. 2, the bi-stable loop conducts a bi-stable current $\pm\Phi/2$ in one of two current directions, and thus as either a first bi-stable current $-\Phi/2$ or a second bi-stable current $\Phi/2$, where $\Phi$ is an SFQ. As described herein, the first and second bi-stable currents $-\Phi/2$ and $\Phi/2$ can be approximately equal and opposite, and can thus be referred to herein as a bi-stable current having a first current direction (e.g., $-\Phi/2$) or a second current direction (e.g., $\Phi/2$). The first bi-stable current (i.e., first direction of the bi-stable current) $-\Phi/2$ can be associated with a first superconducting phase of the first Josephson junction $JJ_1$, and thus to a first data state (e.g., logic 0) of the stored digital state of the Josephson D-gate circuit 50. Similarly, the second bi-stable current (i.e., second direction of the bi-stable current) $\Phi/2$ can be associated with a second superconducting phase of the first Josephson junction $JJ_1$, and thus to a second data state (e.g., logic 1) of the stored digital state of the Josephson D-gate circuit 50. The phase of the first Josephson junction $JJ_1$, and thus the direction of the bi-stable current $\pm\Phi/2$, can be provided as the stored digital state at an output 62, demonstrated as the signal Q.

In response to the enable signal EN (e.g., an enable SFQ pulse) and/or the data signal DT (e.g., a data SFQ pulse), at least one of the Josephson junctions $JJ_1$ through $JJ_4$ can sequentially trigger to change the superconducting phase of the at least one of the Josephson junctions $JJ_1$ through $JJ_4$. The change of the superconducting phase of the at least one of the Josephson junctions $JJ_1$ through $JJ_4$ can change a direction of the bi-stable current $\pm\Phi/2$, and thus can affect the digital state that is stored in the Josephson D-gate circuit 50. For example, the enable signal EN can be provided to initiate a write operation, such that a binary state of the data signal DT can correspond to the digital state that is to be written into the Josephson D-gate circuit. As described previously, the arrangement of the transformers 56 and 58 provide an RQL architecture with respect to the biasing of the Josephson junctions $JJ_1$ through $JJ_4$Therefore, as described herein, the first binary state of the enable signal can correspond to a positive enable SFQ pulse and a subsequent negative enable SFQ pulse, and the second binary state of the data signal can correspond to a positive data SFQ pulse and a subsequent negative data SFQ pulse.

Additionally, the data signal can be time-delayed relative to the enable signal, such that a positive data SFQ pulse can precede a negative enable SFQ pulse. As an example, a positive enable SFQ pulse can initiate the write operation, such that the absence of a positive data SFQ pulse prior to the negative enable SFQ pulse can set the phase of the first Josephson junction $JJ_1$ to provide the first bi-stable current $-\Phi/2$ corresponding to the first data state (e.g., logic 0) based on the triggering of at least one of the Josephson junctions $JJ_1$ through $JJ_4$. As another example, the presence of the positive data SFQ pulse prior to the negative enable SFQ pulse can set the phase of the first Josephson junction $JJ_1$ to provide the second bi-stable current $\Phi/2$ corresponding to the second data state (e.g., logic 1) based on the triggering of at least one of the Josephson junctions $JJ_1$ through $JJ_4$. Furthermore, the presence of a data signal DT in the absence of the enable signal EN can maintain the digital state of the Josephson D-gate circuit 50, as described in greater detail herein.

Figure 3:
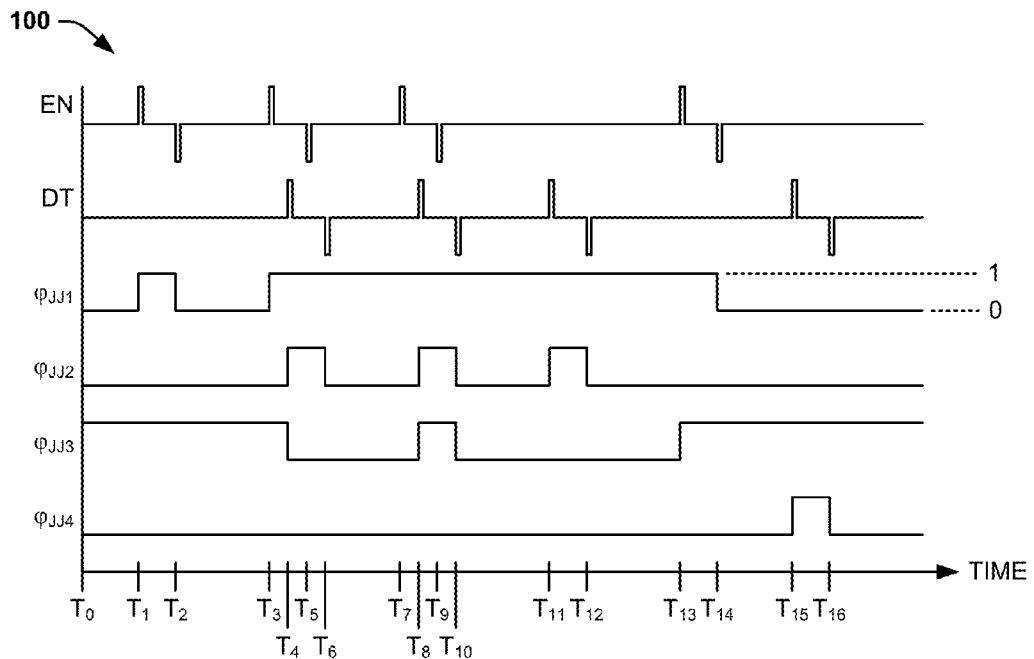
FIG. 3 illustrates an example of a timing diagram.

FIG. 3 illustrates an example of a timing diagram 100. The timing diagram 100 demonstrates the enable signal EN and the data signal DT, which are provided in the timing diagram 100 as a series of positive and negative SFQ pulses. The timing diagram 100 also demonstrates a superconducting phase $\phi$ of each of the Josephson junctions $JJ_1$ through $JJ_4$. Thus, reference is to be made to the example of FIG. 2 in the following description of the example of FIG. 3.

Additionally, because the signal Q at the output 62 corresponds to the phase of the first Josephson junction $JJ_1$, and is thus indicative of the current direction of the bi-stable current $\pm\Phi/2$, the phase of the Josephson junction $JJ_1$ is indicative of the digital state that is stored in the Josephson D-gate circuit 50, as provided in the timing diagram 100 at 102. FIGS. 4-14 correspond to the Josephson D-gate circuit 50 at corresponding times of the timing diagram 100. Therefore, in the following description of the example of FIGS. 4-14, reference is to be made to the example of FIG. 3. Additionally, in the examples of FIGS. 4-14, Josephson junctions that have triggered, and thus have a "logic-high" superconducting phase $\phi$, are demonstrated by an accompanying shaded circle demonstrated at 75. The triggered Josephson junctions with the "logic-high" superconducting phase $\phi$ that are affected by a negative SFQ pulse reset (e.g., untrigger) based on the RQL architecture to return to a "logic-low" superconducting phase $\phi$, as described herein.

Figure 4:
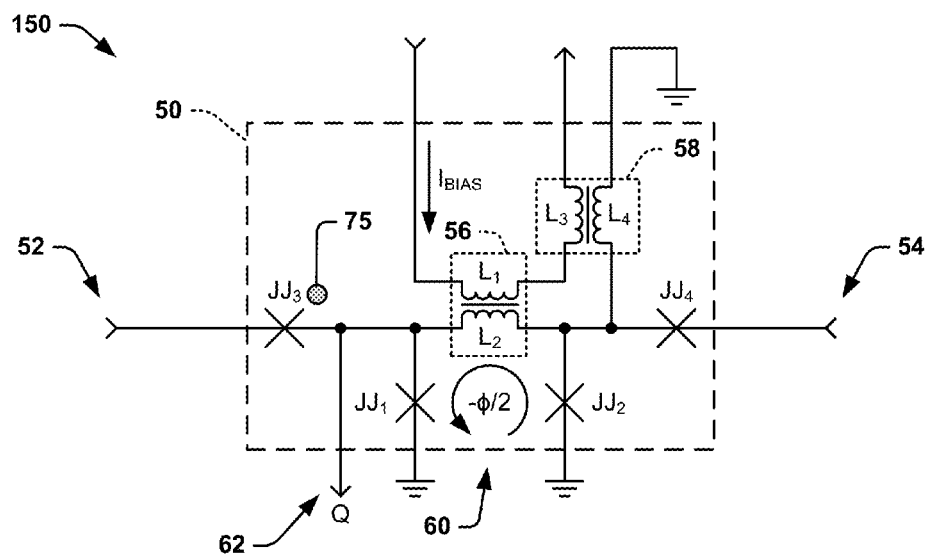
FIG. 4 illustrates an example diagram of a Josephson D-gate circuit in a first initial state.
Figure 5:
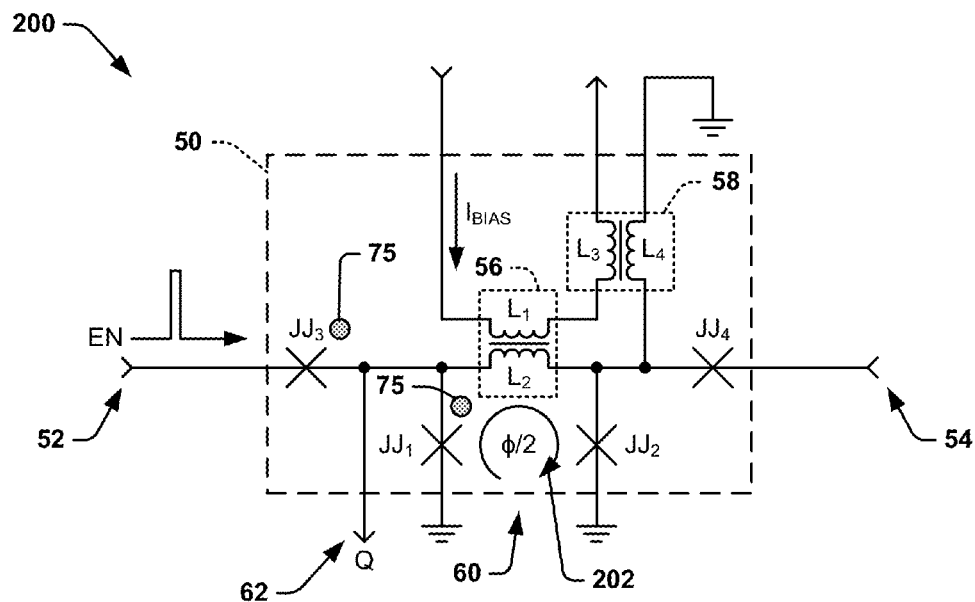
FIG. 5 illustrates an example diagram of a Josephson D-gate circuit in a first transition state.
Figure 6:
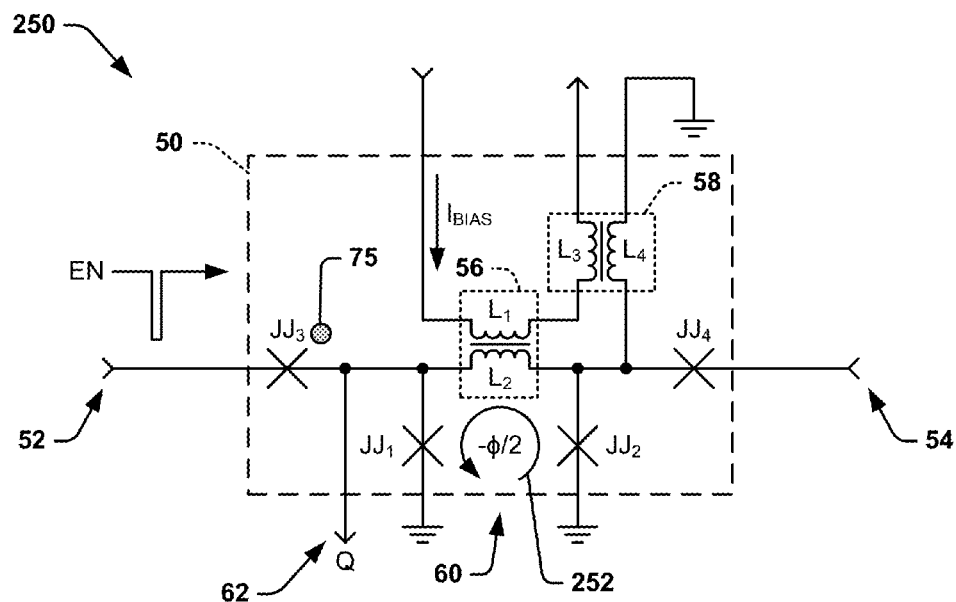
FIG. 6 illustrates an example diagram of a Josephson D-gate circuit in a second transition state.

FIGS. 4-6 collectively demonstrate a sequence of a first write operation in which the first data state (e.g., logic 0) is written into the Josephson D-gate circuit from a first initial state corresponding to the first data state (e.g., logic 0), such as demonstrated at times $T_1$ and $T_2$ in the timing diagram 100 in the example of FIG. 3. FIG. 4 illustrates an example diagram 150 of the Josephson D-gate circuit 50 in the first initial state. In the first write operation, the initial state of the Josephson D-gate circuit 50 can correspond to a time $T_o$ in the timing diagram 100 in the example of FIG. 3, at which the Josephson D-gate circuit stores a first data state (e.g., logic 0) based on a "logic-low" superconducting phase $\phi_{JJ1}$ of the first Josephson junction $JJ_1$, and thus the bi-stable loop 60 conducts the first bi-stable current $-\Phi/2$. The third Josephson junction $JJ_3$ is demonstrated as having a "logic-high" superconducting phase $\phi_{JJ3}$ in the first initial state. At the time $T_0$, neither the enable signal EN nor the data signal DT are provided at the enable input 52 or the data input 54, respectively.

FIG. 5 illustrates an example diagram 200 of the Josephson D-gate circuit 50 in a first transition state. The first transition state can correspond to a positive enable SFQ pulse provided at the enable input 52 while the bi-stable loop 60 conducts the first bi-stable current $-\Phi/2$, such as demonstrated at the time $T_1$ in the timing diagram 100 in the example of FIG. 3. Therefore, the first transition state can correspond to the enabling of a write operation to write a digital state to the Josephson D-gate circuit 50 (e.g., from the first data state (e.g., logic 0) in the second write operation). In the first write operation, in response to the positive enable SFQ pulse at the enable input 52, the first Josephson junction $JJ_1$ triggers to change the bi-stable current direction from the first bi-stable current $-\Phi/2$ to the second bi-stable current $\Phi/2$, demonstrated at 202.

FIG. 6 illustrates an example diagram 250 of the Josephson D-gate circuit 50 in a second transition state. In the first write operation, the second transition state can correspond to a negative enable SFQ pulse provided at the enable input 52 while the bi-stable loop 60 conducts the second bi-stable current $\Phi/2$ in the absence of a data SFQ pulse (e.g., an intervening positive data SFQ pulse) provided at the data input 54, such as demonstrated at the time $T_2$ in the timing diagram 100 in the example of FIG. 3. Because there was no data SFQ pulse, the data signal DT was thus provided in the first binary state (e.g., logic 0) during the first write operation. Therefore, in the first write operation, the second transition state can correspond to the conclusion of a write operation to write the first data state (e.g., logic 0) to the Josephson D-gate circuit 50 from the first initial state corresponding to the first data state (e.g., logic 0). In the example of FIG. 6, in response to the negative enable SFQ pulse at the enable input 52, the first Josephson junction $JJ_1$ resets (i.e., untriggers) to change the bi-stable current direction from the second bi-stable current $\Phi/2$ to the first bi-stable current $-\Phi/2$, demonstrated at 252.

Therefore, as described previously, the examples of FIGS. 4-6 collectively demonstrate a sequence of the first write operation in which the first data state (e.g., logic 0) is written into the Josephson D-gate circuit from a first initial state corresponding to the first data state (e.g., logic 0), such as demonstrated at the times $T_1$ and $T_2$ in the timing diagram 100 in the example of FIG. 3. Between the times $T_1$ and $T_2$ in the timing diagram 100 in the example of FIG. 3, the superconducting phase $\phi_{JJ1}$ of the first Josephson junction $JJ_1$ briefly indicates the second data state, despite the first write operation being directed to the storage of the first data state in the Josephson D-gate circuit 50. However, it is to be understood that the readout circuit 18 in the example of FIG. 1 can be configured to execute a data read subsequent to the conclusion of a write operation (e.g., the first write operation), such that the correct digital state (e.g., the first data state) stored in the Josephson D-gate circuit 50 can be read as the output signal OUT.

FIGS. 4, 5, and 7-9 collectively demonstrate a sequence of a second write operation in which the second data state (e.g., logic 1) is written into the Josephson D-gate circuit from the first initial state corresponding to the first data state (e.g., logic 0), such as demonstrated at times $T_3$-$T_6$ in the timing diagram 100 in the example of FIG. 3. Referring back to the example of FIG. 4, the example diagram 150 demonstrates the Josephson D-gate circuit 50 in the first initial state. In the second write operation, the initial state of the Josephson D-gate circuit 50 can correspond to a time between the time $T_2$ and a time $T_3$ in the timing diagram 100 in the example of FIG. 3, at which the Josephson D-gate circuit stores the first data state (e.g., logic 0) based on a "logic-low" superconducting phase $\phi_{JJ1}$ of the first Josephson junction $JJ_1$, and thus the bi-stable loop 60 conducts the first bi-stable current $-\Phi/2$. The third Josephson junction $JJ_3$ is demonstrated as having a "logic-high" superconducting phase $\phi_{JJ3}$ in the first initial state. At the time between the times $T_2$ and $T_3$ in the timing diagram 100 in the example of FIG. 3, neither the enable signal EN nor the data signal DT are provided at the enable input 52 or the data input 54, respectively.

Referring back to the example of FIG. 5, the example diagram 200 demonstrates the Josephson D-gate circuit 50 in the first transition state, at which the positive enable SFQ pulse is provided at the enable input 52, such as demonstrated at the time $T_3$ in the timing diagram 100 in the example of FIG. 3. Therefore, the first transition state can correspond to the enabling of the write operation to write a digital state to the Josephson D-gate circuit 50 (e.g., from the first data state (e.g., logic 0) in the second write operation). In the second write operation, in response to the positive enable SFQ pulse at the enable input 52, the first Josephson junction $JJ_1$ triggers to change the bi-stable current direction from the first bi-stable current $-\Phi/2$ to the second bi-stable current $\Phi/2$, demonstrated at 202

Figure 7:
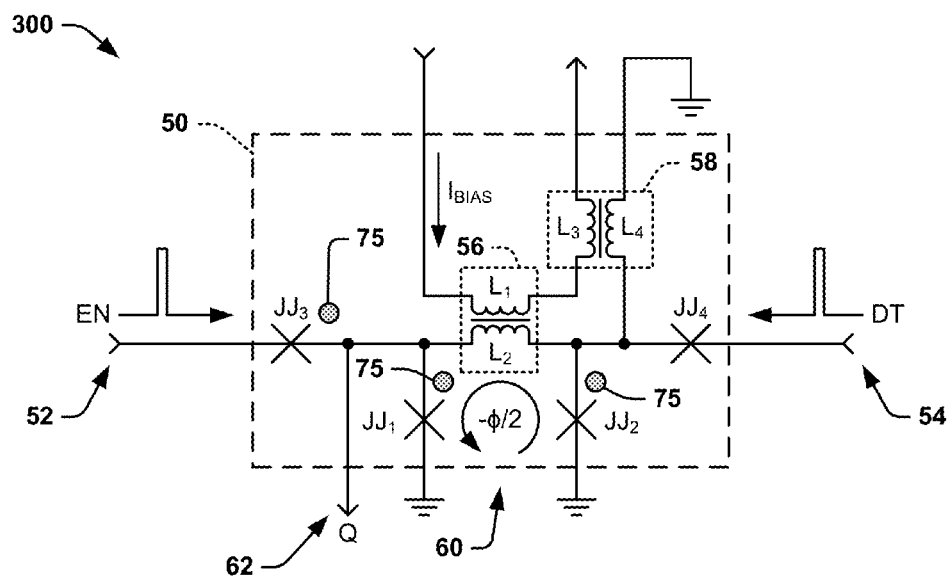
FIG. 7 illustrates an example diagram of a Josephson D-gate circuit in a third transition state.

FIG. 7 illustrates an example diagram 300 of the Josephson D-gate circuit 50 in a third transition state. The third transition state can correspond to a positive data SFQ pulse provided at the data input 54 substantially immediately subsequent to the positive enable SFQ pulse being provided on the enable input 52 while the bi-stable loop 60 conducts the second bi-stable current $\Phi/2$, such as demonstrated at a time $T_4$ in the timing diagram 100 in the example of FIG. 3. In the example of FIG. 7, in response to the positive data SFQ pulse at the data input 54, the second Josephson junction $JJ_2$ triggers to change the bi-stable current direction from the second bi-stable current $\Phi/2$ to the first bi-stable current $-\Phi/2$, demonstrated at 302.

Figure 8:
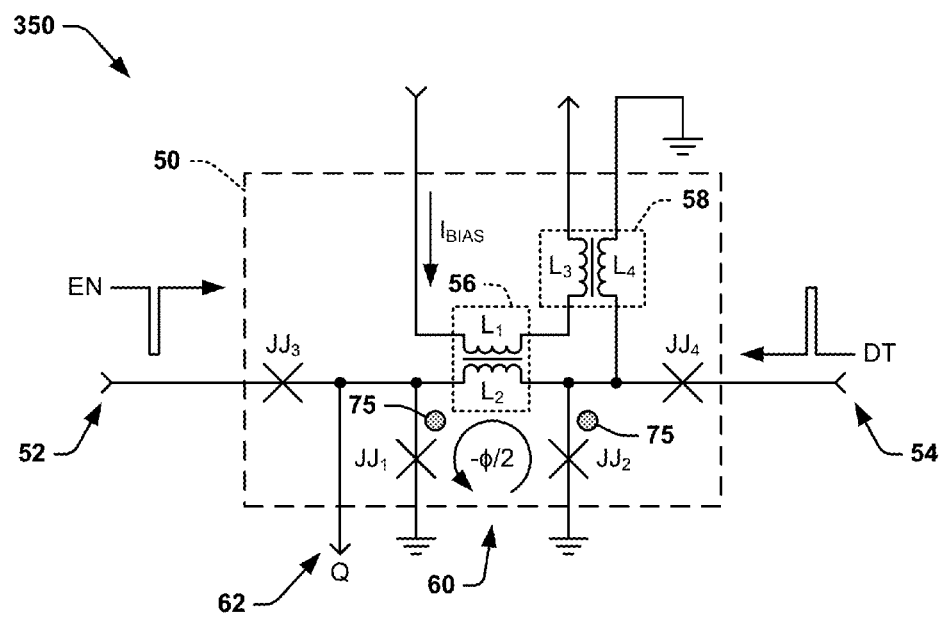
FIG. 8 illustrates an example diagram of a Josephson D-gate circuit in a fourth transition state.

FIG. 8 illustrates an example diagram 350 of the Josephson D-gate circuit 50 in a fourth transition state. The fourth transition state can correspond to a negative enable SFQ pulse provided at the enable input 52 substantially immediately subsequent to the positive data SFQ pulse being provided on the data input 54 while the bi-stable loop 60 conducts the first bi-stable current $-\Phi/2$, such as demonstrated at the time $T_5$ in the timing diagram 100 in the example of FIG. 3. In the example of FIG. 8, in response to the negative enable SFQ pulse at the enable input 52, the third Josephson junction $JJ_3$ resets (e.g., untriggers). The bi-stable current is maintained at the first bi-stable current $-\Phi/2$, demonstrated at 352.

Figure 9:
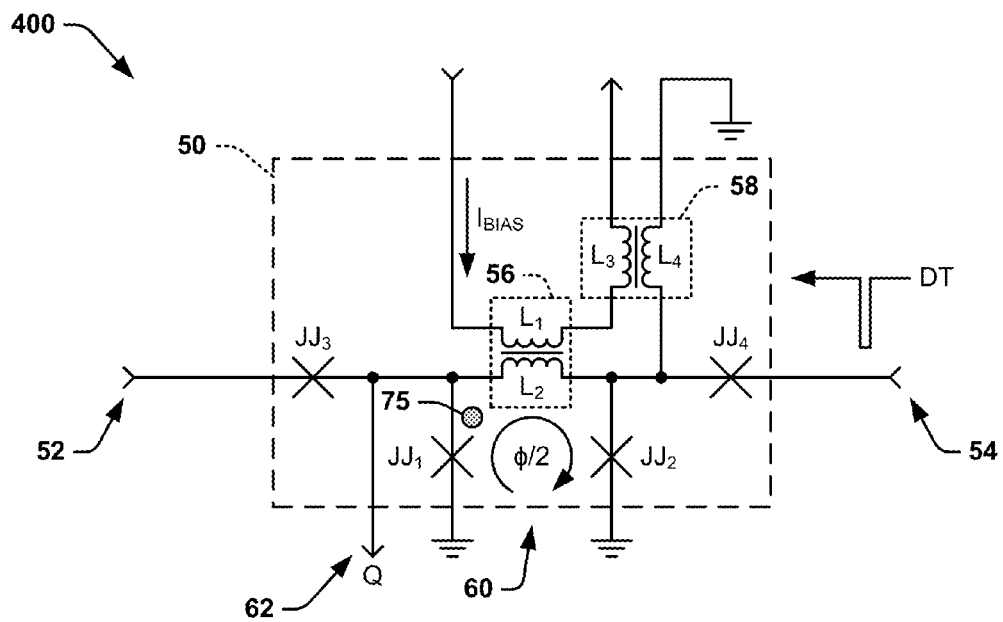
FIG. 9 illustrates an example diagram of a Josephson D-gate circuit in a fifth transition state.

FIG. 9 illustrates an example diagram 400 of the Josephson D-gate circuit 50 in a fifth transition state. The fifth transition state can correspond to a negative data SFQ pulse provided at the data input 54 substantially immediately subsequent to the negative enable SFQ pulse being provided on the enable input 52 while the bi-stable loop 60 conducts the first bi-stable current $-\Phi/2$, such as demonstrated at a time $T_6$ in the timing diagram 100 in the example of FIG. 3. Therefore, in the second write operation, the fifth transition state can correspond to the conclusion of a write operation to write the second data state (e.g., logic 1) to the Josephson D-gate circuit 50 from the first initial state corresponding to the first data state (e.g., logic 0). In the example of FIG. 9, in response to the negative data SFQ pulse at the data input 54, the second Josephson junction $JJ_2$ resets (e.g., untriggers) to change the bi-stable current direction from the first bi-stable current $-\Phi/2$ to the second bi-stable current $\Phi/2$, demonstrated at 402.

Therefore, as described previously, the examples of FIGS. 4, 5, and 7-9 collectively demonstrate a sequence of a second write operation in which the second data state (e.g., logic 1) is written into the Josephson D-gate circuit from the first initial state corresponding to the first data state (e.g., logic 0), such as demonstrated at the times $T_3$-$T_6$ in the timing diagram 100 in the example of FIG. 3. Subsequent to the time $T_6$, the readout circuit 18 in the example of FIG. 1 can be configured to execute a data read subsequent to the conclusion of the second write operation, to read the second data state (e.g., logic 1) as the output signal OUT.

Figure 10:
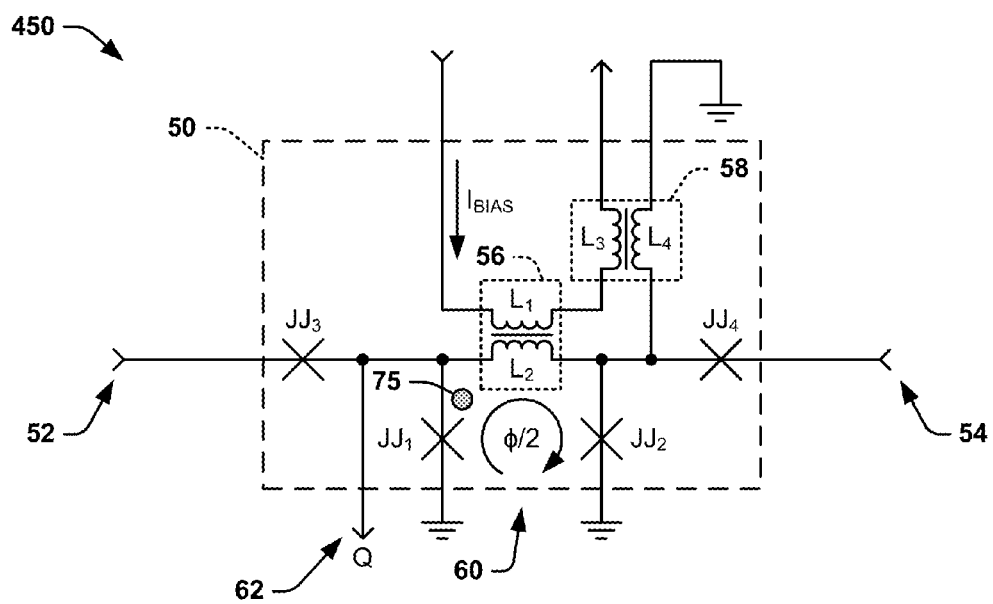
FIG. 10 illustrates an example diagram of a Josephson D-gate circuit in a second initial state.

FIGS. 10, 5, and 7-9 collectively demonstrate a sequence of a third write operation in which the second data state (e.g., logic 1) is written into the Josephson D-gate circuit from a second initial state corresponding to the second data state (e.g., logic 1), such as demonstrated at times $T_7$-$T_{10}$ in the timing diagram 100 in the example of FIG. 3. FIG. 10 illustrates an example diagram 450 of the Josephson D-gate circuit 50 in the second initial state. In the third write operation, the initial state of the Josephson D-gate circuit 50 can correspond to a time between the time $T_6$ and a time $T_7$ in the timing diagram 100 in the example of FIG. 3, at which the Josephson D-gate circuit stores the second data state (e.g., logic 1) based on a "logic-high" superconducting phase $\phi_{JJ1}$ of the first Josephson junction $JJ_1$ and thus the bi-stable loop 60 conducts the second bi-stable current $\Phi/2$. At the time between the times $T_6$ and $T_7$ in the timing diagram 100 in the example of FIG. 3, neither the enable signal EN nor the data signal DT are provided at the enable input 52 or the data input 54, respectively.

Referring back to the example of FIG. 5, the example diagram 200 demonstrates the Josephson D-gate circuit 50 in the first transition state, at which the positive enable SFQ pulse is provided at the enable input 52, such as demonstrated at the time $T_7$ in the timing diagram 100 in the example of FIG. 3. Therefore, the first transition state can correspond to the enabling of the write operation to write a digital state to the Josephson D-gate circuit 50 (e.g., from the second data state (e.g., logic 1) in the third write operation). In the third write operation, in response to the positive enable SFQ pulse at the enable input 52, the third Josephson junction $JJ_3$ triggers, thus maintaining the bi-stable current direction in the second bi-stable current $\Phi/2$, demonstrated at 202.

Referring back to the example of FIG. 7, the example diagram 300 demonstrates the Josephson D-gate circuit 50 in the third transition state. The third transition state can correspond to a positive data SFQ pulse provided at the data input 54 substantially immediately subsequent to the positive enable SFQ pulse being provided on the enable input 52 while the bi-stable loop 60 conducts the second bi-stable current $\Phi/2$, such as demonstrated at a time $T_8$ in the timing diagram 100 in the example of FIG. 3. In the example of FIG. 7, in response to the positive data SFQ pulse at the data input 54, the second Josephson junction $JJ_2$ triggers to change the bi-stable current direction from the second bi-stable current $\Phi/2$ to the first bi-stable current $-\Phi/2$, demonstrated at 302.

Referring back to the example of FIG. 8, the example diagram 350 demonstrates the Josephson D-gate circuit 50 in the fourth transition state. The fourth transition state can correspond to a negative enable SFQ pulse provided at the enable input 52 substantially immediately subsequent to the positive data SFQ pulse being provided on the data input 54 while the bi-stable loop 60 conducts the first bi-stable current $-\Phi/2$, such as demonstrated at the time $T_9$ in the timing diagram 100 in the example of FIG. 3. In the example of FIG. 8, in response to the negative enable SFQ pulse at the enable input 52, the third Josephson junction $JJ_3$ resets (e.g., untriggers). The bi-stable current is maintained at the first bi-stable current $-\Phi/2$, demonstrated at 352.

Referring back to the example of FIG. 9, the example diagram 400 demonstrates the Josephson D-gate circuit 50 in the fifth transition state. The fifth transition state can correspond to a negative data SFQ pulse provided at the data input 54 substantially immediately subsequent to the negative enable SFQ pulse being provided on the enable input 52 while the bi-stable loop 60 conducts the first bi-stable current $-\Phi/2$, such as demonstrated at a time $T_{10}$ in the timing diagram 100 in the example of FIG. 3. Therefore, in the third write operation, the fifth transition state can correspond to the conclusion of a write operation to write the second data state (e.g., logic 1) to the Josephson D-gate circuit 50 from the second initial state corresponding to the second data state (e.g., logic 1). In the example of FIG. 9, in response to the negative data SFQ pulse at the data input 54, the second Josephson junction $JJ_2$ resets (e.g., untriggers) to change the bi-stable current direction from the first bi-stable current $-\Phi/2$ to the second bi-stable current $\Phi/2$, demonstrated at 402.

Therefore, as described previously, the examples of FIGS. 10, 5, and 7-9 collectively demonstrate a sequence of a second write operation in which the second data state (e.g., logic 1) is written into the Josephson D-gate circuit from the second initial state corresponding to the second data state (e.g., logic 1), such as demonstrated at the times $T_7$-$T_{10}$ in the timing diagram 100 in the example of FIG. 3. Subsequent to the time $T_{10}$, the readout circuit 18 in the example of FIG. 1 can be configured to execute a data read subsequent to the conclusion of the third write operation, to read the second data state (e.g., logic 1) as the output signal OUT.

Figure 11:
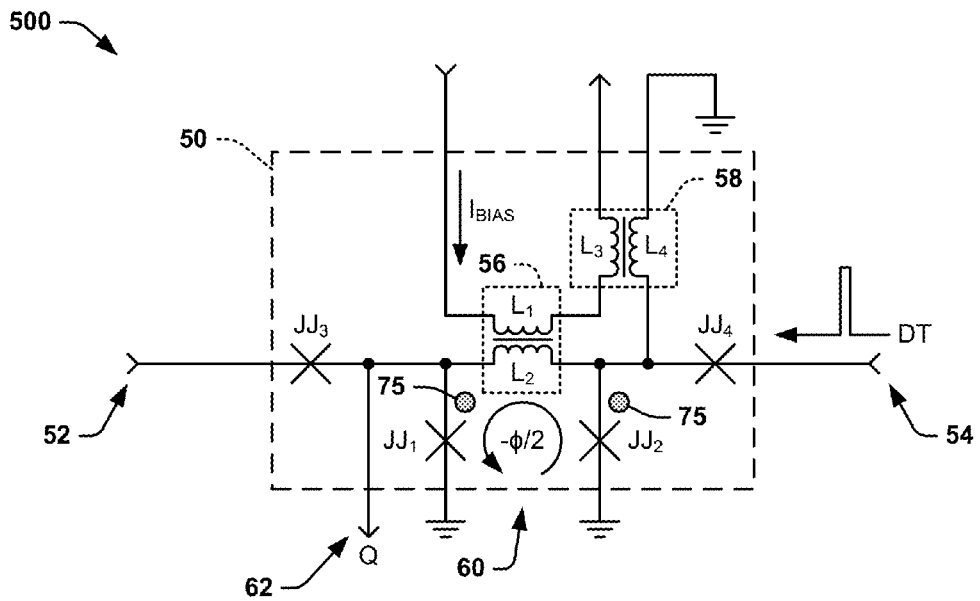
FIG. 11 illustrates an example diagram of a Josephson D-gate circuit in a sixth transition state.
Figure 12:
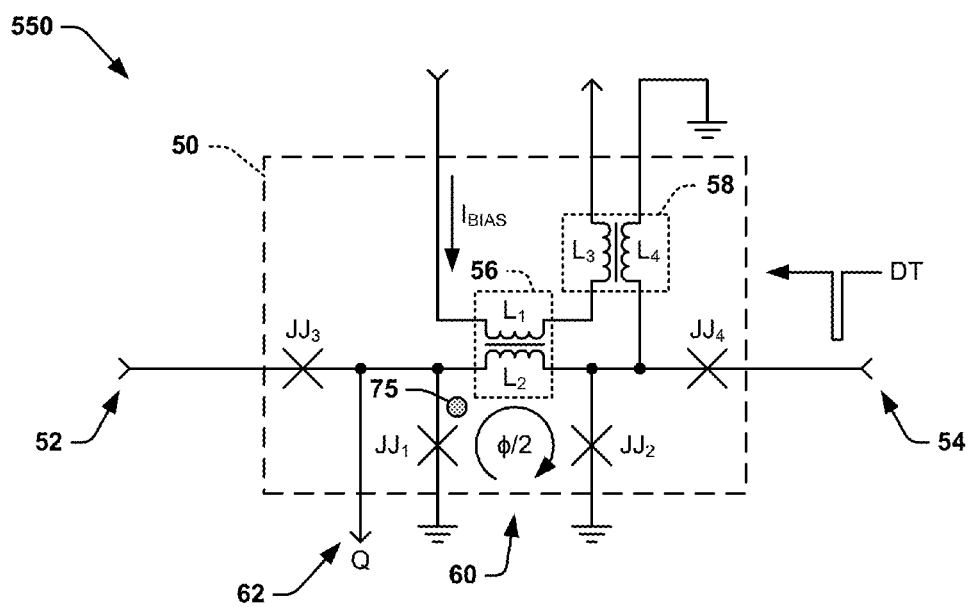
FIG. 12 illustrates an example diagram of a Josephson D-gate circuit in a seventh transition state.

FIGS. 10-12 collectively demonstrate a sequence of a first "half-select" in which the Josephson D-gate circuit stores the second data state (e.g., logic 1), and which no data is written to the Josephson D-gate circuit 50 despite the data signal DT having the second binary state to provide a data SFQ pulse at the data input 54. As an example, a "half-select" can occur when a column of memory cells is selected by a bit-write signal, whereas the corresponding row of memory cells that includes the Josephson D-gate circuit 50 is not selected by a word-write signal. The first "half-select" is demonstrated at times $T_{11}$ and $T_{12}$ in the timing diagram 100 in the example of FIG. 3.

Referring back to the example of FIG. 10, the example diagram 450 demonstrates the Josephson D-gate circuit 50 in the second initial state. In the first "half-select", the initial state of the Josephson D-gate circuit 50 can correspond to a time between the time $T_{10}$ and a time $T_{11}$ in the timing diagram 100 in the example of FIG. 3, at which the Josephson D-gate circuit stores the second data state (e.g., logic 1) based on a "logic-high" superconducting phase $\phi_{JJ1}$ of the first Josephson junction $JJ_1$, and thus the bi-stable loop 60 conducts the second bi-stable current $\Phi/2$. At the time between the times $T_{10}$ and $T_{11}$ in the timing diagram 100 in the example of FIG. 3, neither the enable signal EN nor the data signal DT are provided at the enable input 52 or the data input 54, respectively.

FIG. 11 illustrates an example diagram 500 of the Josephson D-gate circuit 50 in a sixth transition state. The sixth transition state can correspond to a positive data SFQ pulse provided at the data input 54 in the absence of an enable SFQ pulse (e.g., a substantially immediately previous positive enable SFQ pulse) provided at the enable input 52, such as demonstrated at a time $T_{11}$ in the timing diagram 100 in the example of FIG. 3. In the example of FIG. 11, in response to the positive data SFQ pulse at the data input 54, the second Josephson junction $JJ_2$ triggers to change the bi-stable current direction from the second bi-stable current $\Phi/2$ to the first bi-stable current $-\Phi/2$, demonstrated at 502.

FIG. 12 illustrates an example diagram 550 of the Josephson D-gate circuit 50 in a seventh transition state. The seventh transition state can correspond to a negative data SFQ pulse provided at the data input 54 in the absence of an enable SFQ pulse (e.g., an intervening negative enable SFQ pulse) provided at the enable input 52, such as demonstrated at a time $T_{12}$ in the timing diagram 100 in the example of FIG. 3. Therefore, in the first "half-select", the seventh transition state can correspond to the conclusion of the first "half-select", and thus the second data state is not written into the Josephson D-gate circuit 50. In the example of FIG. 12, in response to the negative data SFQ pulse at the data input 54, the second Josephson junction $JJ_2$ resets (e.g., untriggers) to change the bi-stable current direction from the first bi-stable current $-\Phi/2$ to the second bi-stable current $\Phi/2$, demonstrated at 552.

FIGS. 10, 5, and 6 collectively demonstrate a sequence of a fourth write operation in which the first data state (e.g., logic 0) is written into the Josephson D-gate circuit from the second initial state corresponding to the second data state (e.g., logic 1), such as demonstrated at times $T_{13}$ and $T_{14}$ in the timing diagram 100 in the example of FIG. 3. Referring back to the example of FIG. 10, the example diagram 450 demonstrates the Josephson D-gate circuit 50 in the second initial state. In the fourth write operation, the initial state of the Josephson D-gate circuit 50 can correspond to a time between the time $T_{12}$ and a time $T_{13}$ in the timing diagram 100 in the example of FIG. 3, at which the Josephson D-gate circuit stores the second data state (e.g., logic 1) based on a "logic-high" superconducting phase $\phi_{JJ1}$ of the first Josephson junction $JJ_1$, and thus the bi-stable loop 60 conducts the second bi-stable current $\Phi/2$. At the time between the times $T_{12}$ and $T_{13}$ in the timing diagram 100 in the example of FIG. 3, neither the enable signal EN nor the data signal DT are provided at the enable input 52 or the data input 54, respectively.

Referring back to the example of FIG. 5, the example diagram 200 demonstrates the Josephson D-gate circuit 50 in the first transition state, at which the positive enable SFQ pulse is provided at the enable input 52, such as demonstrated at the time $T_{13}$ in the timing diagram 100 in the example of FIG. 3. Therefore, the first transition state can correspond to the enabling of the write operation to write a digital state to the Josephson D-gate circuit 50 (e.g., from the second data state (e.g., logic 1) in the fourth write operation). In the fourth write operation, in response to the positive enable SFQ pulse at the enable input 52, the third Josephson junction $JJ_3$ triggers, thus maintaining the bi-stable current direction in the second bi-stable current $\Phi/2$, demonstrated at 202.

Referring back to the example of FIG. 6, the example diagram 250 demonstrates the Josephson D-gate circuit 50 in the second transition state. In the fourth write operation, the second transition state can correspond to a negative enable SFQ pulse provided at the enable input 52 while the bi-stable loop 60 conducts the second bi-stable current $\Phi/2$ in the absence of a data SFQ pulse (e.g., an intervening positive data SFQ pulse) provided at the data input 54, such as demonstrated at the time $T_{14}$ in the timing diagram 100 in the example of FIG. 3. Because there was no data SFQ pulse, the data signal DT was thus provided in the first binary state (e.g., logic 0) during the fourth write operation. Therefore, in the fourth write operation, the second transition state can correspond to the conclusion of the write operation to write the first data state (e.g., logic 0) to the Josephson D-gate circuit 50 from the second initial state corresponding to the second data state (e.g., logic 1). In the example of FIG. 6, in response to the negative enable SFQ pulse at the enable input 52, the first Josephson junction $JJ_1$ resets (i.e., untriggers) to change the bi-stable current direction from the second bi-stable current $\Phi/2$ to the first bi-stable current $-\Phi/2$, demonstrated at 252.

Therefore, as described previously, the examples of FIGS. 10, 5, and 6 collectively demonstrate a sequence of a fourth write operation in which the first data state (e.g., logic 0) is written into the Josephson D-gate circuit from the second initial state corresponding to the second data state (e.g., logic 1), such as demonstrated at the times $T_{13}$-$T_{14}$ in the timing diagram 100 in the example of FIG. 3. Subsequent to the time $T_{14}$, the readout circuit 18 in the example of FIG. 1 can be configured to execute a data read subsequent to the conclusion of the fourth write operation, to read the first data state (e.g., logic 0) as the output signal OUT.

Figure 13:
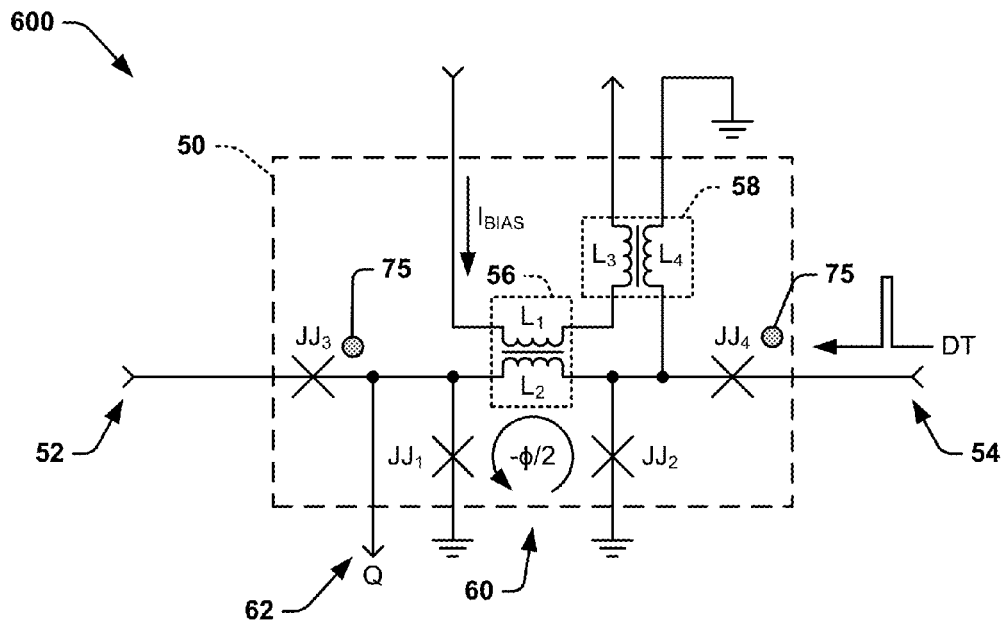
FIG. 13 illustrates an example diagram of a Josephson D-gate circuit in an eighth transition state.
Figure 14:
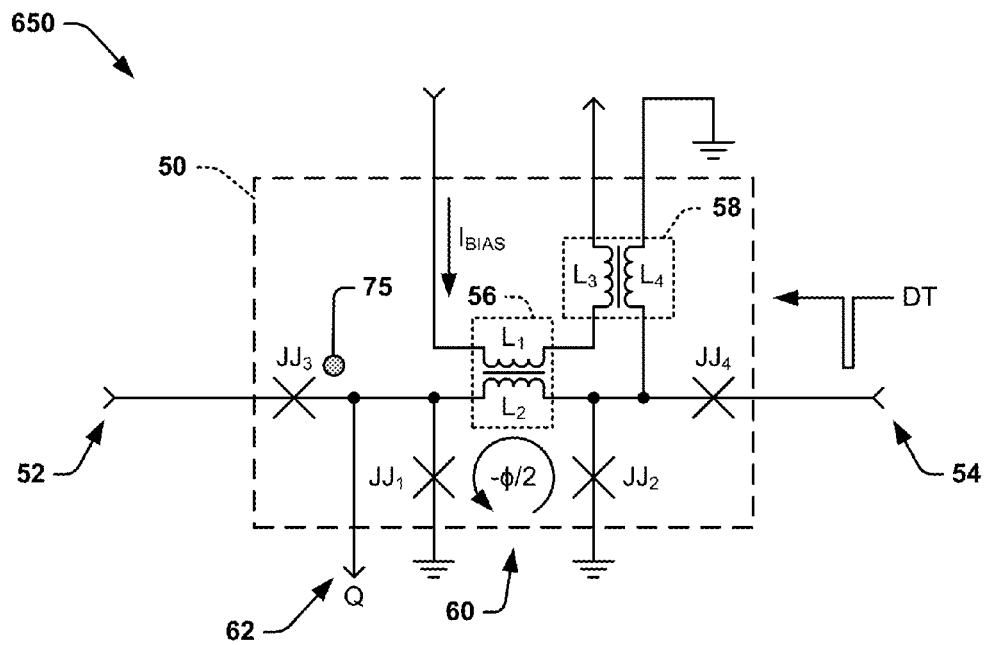
FIG. 14 illustrates an example diagram of a Josephson D-gate circuit in a ninth transition state.

FIGS. 4, 13, and 14 collectively demonstrate a sequence of a second "half-select" in which the Josephson D-gate circuit stores the first data state (e.g., logic 0), and which no data is written to the Josephson D-gate circuit 50 despite the data signal DT having the second binary state to provide a data SFQ pulse at the data input 54. As described previously, a "half-select" can occur when a column of memory cells is selected by a bit-write signal, whereas the corresponding row of memory cells that includes the Josephson D-gate circuit 50 is not selected by a word-write signal. The second "half-select" is demonstrated at times $T_{13}$ and $T_{14}$ in the timing diagram 100 in the example of FIG. 3.

Referring back to the example of FIG. 4, the example diagram 150 demonstrates the Josephson D-gate circuit 50 in the first initial state. In the second "half-select", the initial state of the Josephson D-gate circuit 50 can correspond to a time between the time $T_{12}$ and a time $T_{13}$ in the timing diagram 100 in the example of FIG. 3, at which the Josephson D-gate circuit stores the first data state (e.g., logic 0) based on a "logic-low" superconducting phase ($p_m$ of the first Josephson junction $JJ_1$, and thus the bi-stable loop 60 conducts the first bi-stable current $-\Phi/2$. The third Josephson junction $JJ_3$ is demonstrated as having a "logic-high" superconducting phase ($p_m$ in the first initial state. At the time between the times $T_{12}$ and $T_{13}$ in the timing diagram 100 in the example of FIG. 3, neither the enable signal EN nor the data signal DT are provided at the enable input 52 or the data input 54, respectively.

FIG. 13 illustrates an example diagram 600 of the Josephson D-gate circuit 50 in an eighth transition state. The eighth transition state can correspond to a positive data SFQ pulse provided at the data input 54 in the absence of an enable SFQ pulse (e.g., a substantially immediately previous positive enable SFQ pulse) provided at the enable input 52 while the bi-stable loop 60 conducts the first bi-stable current $-\Phi/2$, such as demonstrated at a time $T_{13}$ in the timing diagram 100 in the example of FIG. 3. In the example of FIG. 13, in response to the positive data SFQ pulse at the data input 54, the fourth Josephson junction $JJ_4$ triggers to maintain the bi-stable current as the first bi-stable current $-\Phi/2$, demonstrated at 602.

FIG. 14 illustrates an example diagram 650 of the Josephson D-gate circuit 50 in a ninth transition state. The ninth transition state can correspond to a negative data SFQ pulse provided at the data input 54 in the absence of an enable SFQ pulse (e.g., an intervening negative enable SFQ pulse) provided at the enable input 52, such as demonstrated at a time $T_{14}$ in the timing diagram 100 in the example of FIG. 3. Therefore, in the second "half-select", the ninth transition state can correspond to the conclusion of the second "half-select", and thus the second data state is not written into the Josephson D-gate circuit 50. In the example of FIG. 14, in response to the negative data SFQ pulse at the data input 54, the fourth Josephson junction $JJ_4$ resets (e.g., untriggers) to maintain the bi-stable current as the first bi-stable current $-\Phi/2$, demonstrated at 652.

Accordingly, the examples of FIGS. 3-14 demonstrate the various state changes of the digital state stored in the Josephson D-gate circuit 50. Specifically, the examples of FIGS. 4-6 collectively demonstrate a sequence of a first write operation in which the first data state (e.g., logic 0) is written into the Josephson D-gate circuit from a first initial state corresponding to the first data state (e.g., logic 0), such as demonstrated at times $T_1$ and $T_2$ in the timing diagram 100 in the example of FIG. 3. The examples of FIGS. 4, 5, and 7-9 collectively demonstrate a sequence of a second write operation in which the second data state (e.g., logic 1) is written into the Josephson D-gate circuit from the first initial state corresponding to the first data state (e.g., logic 0), such as demonstrated at times $T_3$-$T_6$ in the timing diagram 100 in the example of FIG. 3. The examples of FIGS. 10, 5, and 7-9 collectively demonstrate a sequence of a third write operation in which the second data state (e.g., logic 1) is written into the Josephson D-gate circuit from a second initial state corresponding to the second data state (e.g., logic 1), such as demonstrated at times $T_7$-$T_{10}$ in the timing diagram 100 in the example of FIG. 3. The examples of FIGS. 10-12 collectively demonstrate a sequence of a first "half-select" in which the Josephson D-gate circuit stores the second data state (e.g., logic 1), and which no data is written to the Josephson D-gate circuit 50, such as demonstrated at times $T_{11}$ and $T_{12}$ in the timing diagram 100 in the example of FIG. 3. The examples of FIGS. 10, 5, and 6 collectively demonstrate a sequence of a fourth write operation in which the first data state (e.g., logic 0) is written into the Josephson D-gate circuit from the second initial state corresponding to the second data state (e.g., logic 1), such as demonstrated at times $T_{13}$ and $T_{14}$ in the timing diagram 100 in the example of FIG. 3. Lastly, the examples of FIGS. 4, 13, and 14 collectively demonstrate a sequence of a second "half-select" in which the Josephson D-gate circuit stores the first data state (e.g., logic 0), and which no data is written to the Josephson D-gate circuit 50, such as demonstrated at times $T_{13}$ and $T_{14}$ in the timing diagram 100 in the example of FIG. 3.

Figure 15:
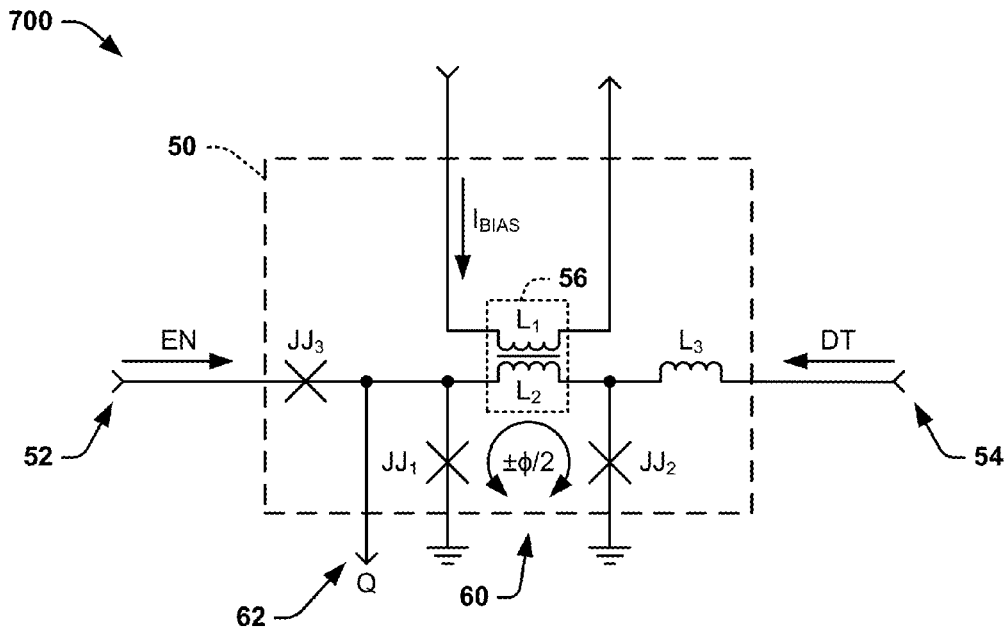
FIG. 15 illustrates another example of a Josephson D-gate circuit.

FIG. 15 illustrates another example of a Josephson D-gate circuit 700. The Josephson D-gate circuit 700 can correspond to the Josephson D-gate circuit 12 in the example of FIG. 1 as an alternative example to the Josephson D-gate circuit 50 in the example of FIG. 2. Thus, reference is to be made to the example of FIG. 1 in the following description of the example of FIG. 15.

The Josephson D-gate circuit 700 includes an enable input 702 on which the enable signal EN is provided and a data input 704 on which the data signal DT is provided. The Josephson D-gate circuit 700 also includes a transformer 706 that includes a first inductor $L_5$ at a primary and a second inductor $L_6$ at a secondary. A bias current $I_{BIAS}$ is provided through the inductor $L_5$ to induce a bias current in the inductor $L_6$ to implement an RQL architecture. The Josephson D-gate circuit 700 also includes a bi-stable loop 758 that is formed by a first Josephson junction $JJ_5$, a second Josephson junction $JJ_6$, and the inductor $L_6$. The Josephson-D gate 700 also includes a third Josephson junction $JJ_7$ interconnecting the enable input 702 and the bi-stable loop 758, and an inductor $L_7$ interconnecting the data input 704 and the bi-stable loop 758.

Similar to as described previously in the example of FIG. 2, the bi-stable loop 758 conducts a bi-stable current $\pm\phi/2$ in one of two current directions, and thus as either a first bi-stable current $-\Phi/2$ or a second bi-stable current $\Phi/2$. The phase of the first Josephson junction $JJ_1$, and thus the direction of the bi-stable current $\pm\Phi/2$, can be provided as the stored digital state at an output 760, demonstrated as the signal Q. The Josephson D-gate circuit 700 is configured to operate substantially similar to the Josephson D-gate circuit 50 in the example of FIG. 2 with respect to the sequential switching of the Josephson junctions $JJ_5$, $JJ_6$, and $JJ_7$ in a manner substantially similar to the respective Josephson junctions $JJ_1$, $JJ_2$, and $JJ_3$. In the example of FIG. 15, the fourth Josephson junction $JJ_4$ in the Josephson D-gate circuit 50 and the biasing transformer 58 is replaced by the inductor $L_7$. Thus, instead of the triggering of the fourth Josephson junction $JJ_4$, such as in the second "half-select" described previously in the examples of FIGS. 4, 13, and 14, the energy of the positive data SFQ pulse provided on the data input 754 is stored in the inductor $L_7$ and is discharged by the negative data SFQ pulse. Thus, while the inductor $L_7$ provides an inductive load to the data input 754, it provides a more space-efficient configuration for the Josephson D-gate circuit 700.

Figure 16:
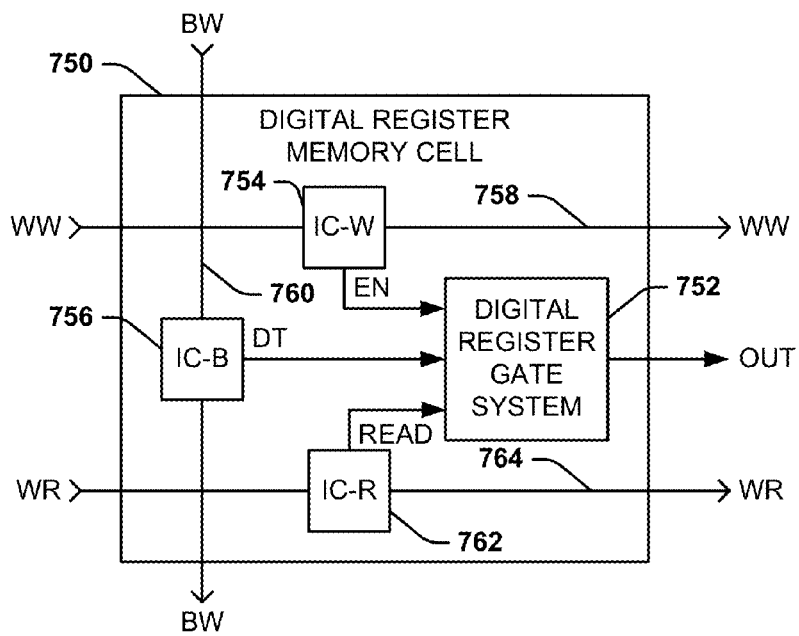
FIG. 16 illustrates an example of a memory cell.

FIG. 16 illustrates an example of a memory cell 750. The memory cell 750 can correspond to a single memory cell of a plurality of memory cells in a memory system, such as arranged in rows and columns. The memory cell 750 includes a superconductive gate system 752, such as the superconductive gate system 10 in the example of FIG. 1. Thus, the superconductive gate system 750 can include a Josephson D-gate circuit, such as the Josephson D-gate circuit 50 in the example of FIG. 2 or the Josephson D-gate circuit in the example of FIG. 15. The superconductive gate system 750 can thus also include a readout circuit, such as the readout circuit 18 in the example of FIG. 1, to provide an output signal OUT corresponding to the digital state stored in the respective Josephson D-gate circuit during a read operation.

In the example of FIG. 16, the memory cell 750 also includes a first interconnect 754, demonstrated as "IC-W", and a second interconnect 756, demonstrated as "IC-B". The first interconnect 754 can couple an enable input of the respective Josephson D-gate circuit of the superconductive gate system 752 to a word-line 758 on which a word-write signal WW is provided. As an example, the word-line 758 can be configured as a Josephson transmission line (JTL), such that the first interconnect 754 can be configured as an active interconnect and the word-write signal WW can be configured as an enable SFQ pulse. The first interconnect 754 can thus generate the enable signal EN from the word-write signal WW, such as an enable SFQ pulse (e.g., positive and negative enable SFQ pulses in an RQL manner). As another example, the first interconnect 754 can be configured as a passive interconnect and the word-write signal WW can be a digital signal having a first binary state corresponding to the first binary state of the enable signal EN, such that the first interconnect 754 provides no SFQ pulse, and having a second binary state corresponding to the second binary state of the enable signal EN, such that the first interconnect 754 provides an enable SFQ pulse. As an example, the word-line 758 can be coupled to each of a plurality of memory cells in a row of an array of memory cells that includes the memory cell 750. Thus, the first interconnect 754 can generate an enable SFQ pulse from the word-write signal WW that is provided to enable a write operation of the row of memory cells, such as by splitting an SFQ pulse off from the word-line 758 configured as a JTL.

The second interconnect 756 can couple a data input of the respective Josephson D-gate circuit of the superconductive gate system 752 to a bit-line 760 on which a bit-write signal BW is provided. As an example, the bit-line 760 can be configured as a JTL, such that the second interconnect 756 can be configured as an active interconnect and the bit-write signal BW can be configured as an SFQ pulse. The second interconnect 756 can thus be configured to generate the data signal DT from the bit-write signal, such as a data SFQ pulse (e.g., positive and negative data SFQ pulses in an RQL manner). As another example, the second interconnect 756 can be configured as a passive interconnect and the bit-write signal BW can be a digital signal having a first binary state corresponding to the first binary state of the data signal DT, such that the second interconnect 756 provides no SFQ pulse, and having a second binary state corresponding to the second binary state of the data signal DT, such that the second interconnect 756 provides a data SFQ pulse. As an example, the bit-line 760 can be coupled to each of a plurality of memory cells in a column of an array of memory cells that includes the memory cell 750. Thus, the second interconnect 756 can generate a data SFQ pulse from the bit-write signal BW that is provided or not provided to write data into the memory cell 750, such as by splitting an SFQ pulse off from the bit-line 760 configured as a JTL. Therefore, the memory cell 750 can be selected by the word-write signal WW (e.g., an enable SFQ pulse that is propagated along the word-line 758 configured as a JTL) to store a digital state in the bi-stable loop of the respective Josephson D-gate circuit in the superconductive gate system 752, with the digital state corresponding to either a data SFQ pulse or no data SFQ pulse provided as the data signal DT.

In addition, in the example of FIG. 16, the memory cell 750 further includes a third interconnect 762, demonstrated as "IC-R". The third interconnect 762 can couple a read input associated with a readout circuit (e.g., the readout circuit 18 in the example of FIG. 1) of the respective Josephson D-gate circuit of the superconductive gate system 752 to a read-line 764 on which a word-read signal WR is provided. As an example, the read-line 764 can be configured as a JTL, such that the third interconnect 762 can be configured as an active interconnect and the word-read signal WR can be configured as a read SFQ pulse. The third interconnect 762 can thus generate the read signal READ from the word-read signal WR (e.g., positive and negative read SFQ pulses in an RQL manner). As another example, the third interconnect 762 can be configured as a passive interconnect and the word-read signal WR can be a digital signal having a first binary state corresponding to the read signal READ being provided as a read SFQ pulse to read the digital state from the Josephson D-gate circuit of the superconductive gate system 752, and a second binary state corresponding to the read signal READ being provided as no read SFQ pulse. As an example, the read-line 764 can be coupled to each of a plurality of memory cells in a row of an array of memory cells that includes the memory cell 750. Thus, the third interconnect 762 can generate a read SFQ pulse from the word-read signal WR that is provided to enable a read operation of the row of memory cells, such as by splitting an SFQ pulse off from the read-line 762 configured as a JTL The memory cell 750 can be implemented in a much more efficient manner than other types of Josephson gate systems based on the implementation of only a single interconnect for each of the word-write line 758 and the bit-write line 760. As an example, other types of memory cell systems, such as a Josephson set-reset (S-R) gate can implement a plurality of interconnects and interposing logic to convert a given word-write signal WW and a given bit-write signal BW to respective inputs (e.g., set and reset inputs, respectively). For example, a Josephson S-R gate can include as many as fourteen interconnects and three logic gates (e.g., AND-gates and/or inverters) to provide sufficient logic operations to generate the set and reset signals as inputs based on a given word-write signal and a given bit-write signal. Accordingly, the memory cell 750 that implements a Josephson D-gate circuit, such as such as the Josephson D-gate circuit 50 in the example of FIG. 2 or the Josephson D-gate circuit in the example of FIG. 15, can be a much more efficient implementation for a Josephson memory device.

Figure 17:
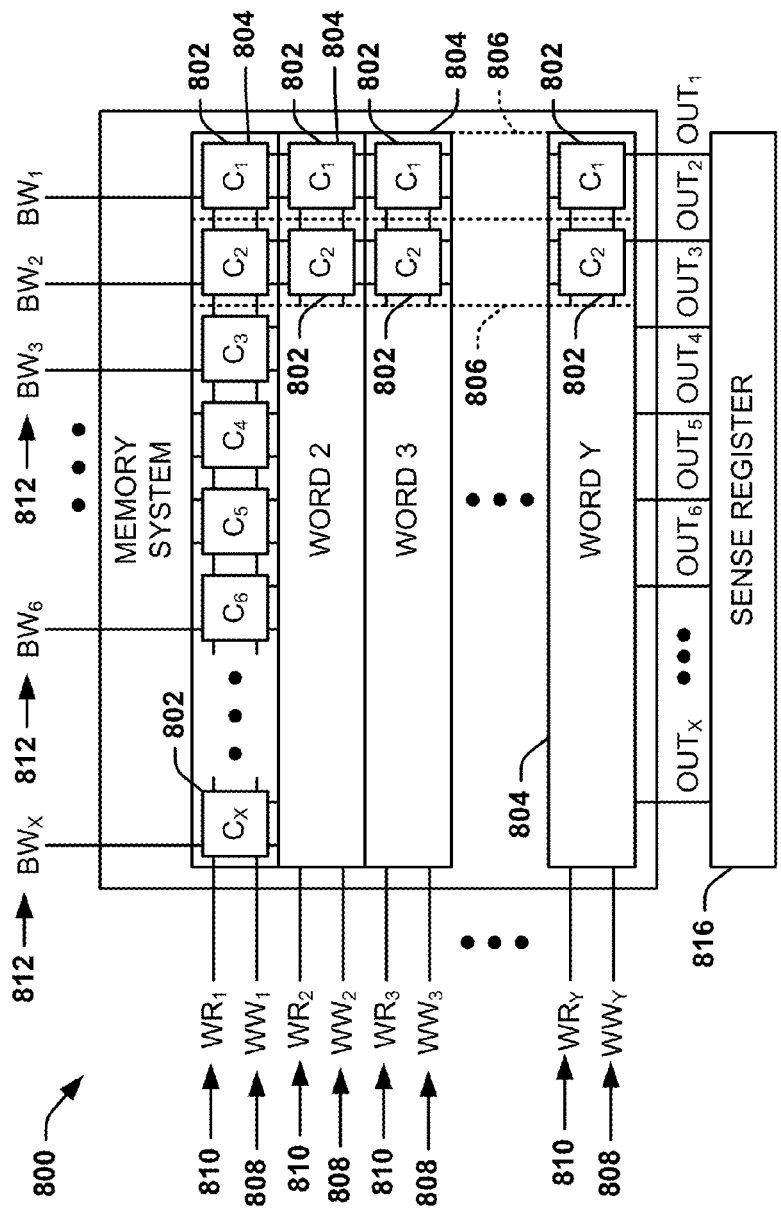
FIG. 17 illustrates an example of a memory system.

FIG. 17 illustrates an example of a memory system 800. The memory system 800 can be implemented as a memory structure in a variety of quantum and/or classical computing applications. As an example, the memory system 800 can be configured cryogenically in a quantum computing circuit, such as operating at approximately 4 Kelvin or less, to store classical data and/or controller instructions in a quantum computing environment.

The memory system 800 is demonstrated in the example of FIG. 17 as being arranged as an array of memory cells 802. Specifically, the memory cells 802 are arranged in rows 804 that each correspond to a data word, demonstrated as WORD 1 through WORD Y, where Y is an integer greater than 1. Each of the rows 804 includes a set of memory cells 802 that form X columns 806 across the rows 804, with the memory cells 802 in WORD 1 being demonstrated in the example of FIG. 17 as $C_1$ to $C_X$, where X is an integer greater than 1. Therefore, each of the memory cells 802 in the array of the memory system 800 can be individually addressable by row 804 and column 806.

In the example of FIG. 17, each of the rows 804 is demonstrated as having an associated word-write line 808 and word-read line 810, demonstrated as providing word-write and word-read signals $WW_1$ and $WR_1$ through $WW_Y$ and $WR_Y$, respectively. The word-write lines 808 and word-read lines 810 can be coupled to each of the memory cells 802 in each of the rows 804 of the memory system 800, such as via interconnects (e.g., a first interconnect 754 in each of the memory cells 802). In addition, each of the memory cells 802 is demonstrated as having an associated bit-write line 812, demonstrated as providing bit-write signals $BW_1$ through $BW_X$. The bit-write lines 812 can be coupled to each corresponding numbered memory cell 802 in each of the columns 806 of the memory system 800, such as via interconnects (e.g., a second interconnect 756 in each of the memory cells 802).

Each of the memory cells 802 is configured to store a single bit of data as a respective digital state. Specifically, each of the memory cells 802 can be configured substantially similar to the memory cell 750 in the example of FIG. 16. Specifically, each of the memory cells 802 can include a superconductive gate system 752 and the first and second interconnects 754 and 756. The digital state of each of the memory cells 802 can be set in response to a respective word-write signal WW that is provided on the respective word-write line 808 to provide respective enable signals EN (e.g., enable SFQ pulses) to activate each of the memory cells 802 for a write operation, and a bit-write signal BW that is provided on the respective bit-write line 812 to provide respective data signals DT (e.g., data SFQ pulses) to write the digital state to the respective activated memory cells 802. As an example, the word-write signals WW and the bit-write signals BW can be provided as respective SFQ pulses that propagate along the respective word-write lines 808 and bit-write lines 812. As another example, the word-write signals WW and the bit-write signals BW can be digital signals that are provided on the respective word-write lines 808 and bit-write lines 812. For example, the word-write signal WW can have a first digital state corresponding to selection of the respective word-write line 808 to enable writing data into the corresponding memory cells 802, such as based on generating enable SFQ pulses via the first interconnect 754, and a second digital state to disable writing data into the corresponding memory cells 802 (e.g., no enable SFQ pulse generated at the first interconnect 754). Similarly, the bit-write signal BW can have a first digital state corresponding to a first data state to be written into the corresponding memory cell 802, such as based on generating data SFQ pulses via the second interconnect 756, and a second digital state corresponding to a second data state to be written into the corresponding memory cell 802 (e.g., no data SFQ pulse generated at the second interconnect 756).

Similarly, the respective digital state that is stored in each of the memory cells 802 can be read from the memory cells 802 based on a word-read signal WR that is provided on the respective word-read line 810 to select a given one of the rows 804. As an example, the output of each of the memory cells 802 can be coupled to a sense register 816 that is configured to determine whether digital state of each of the memory cells 802 of an associated row 804 correspond to a binary logic-1 state or a binary logic-0 state in response to a read signal READ, similar to as described previously in the example of FIG. 1, based on the respective word-read signal WR (e.g., via a read interconnect). Accordingly, the sense register 816 can read out the digital states of the memory cells 802 as respective output signals $OUT_1$ through $OUT_X$ via respective readout circuits (e.g., the readout circuit 18 in the example of FIG. 1).

Figure 18:
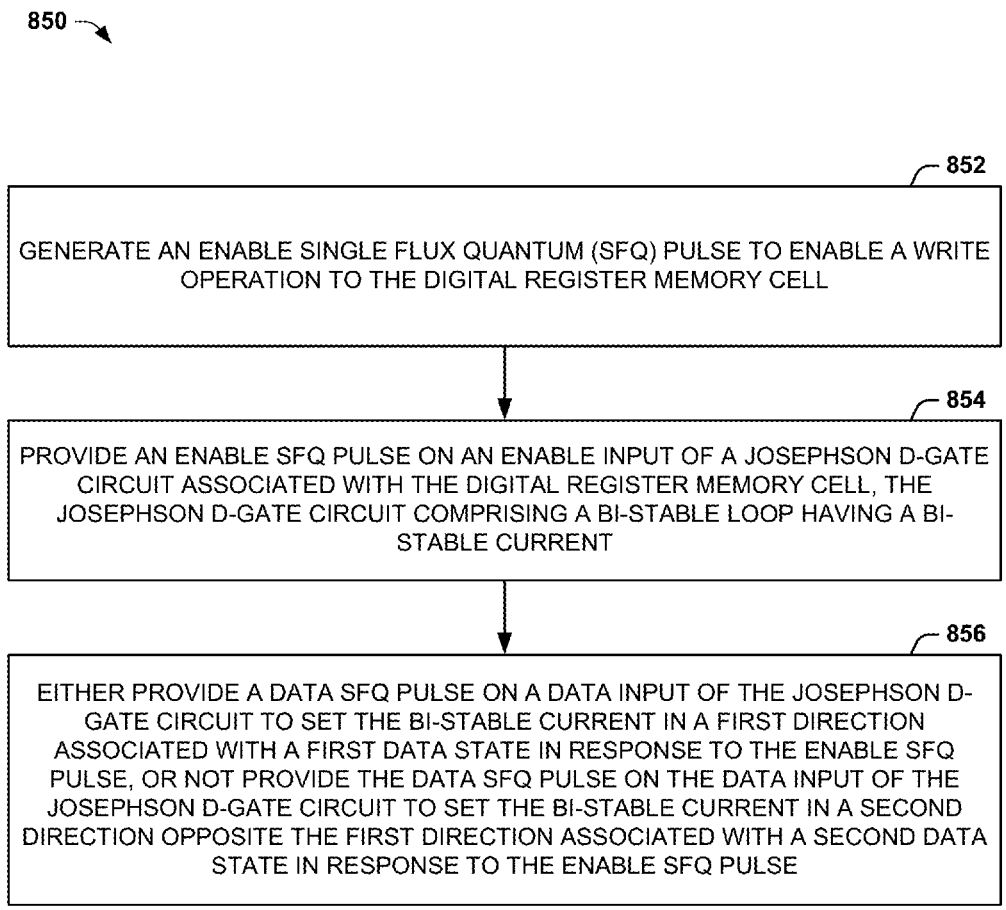
FIG. 18 illustrates an example of a method for writing a digital state into a memory cell.

In view of the foregoing structural and functional features described above, a methodology in accordance with various aspects of the present invention will be better appreciated with reference to FIG. 18. While, for purposes of simplicity of explanation, the methodology of FIG. 18 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 18 illustrates an example of a method 850 for writing a digital state into a memory cell (e.g., the memory cell 750). At 852, an enable SFQ pulse (e.g., the enable signal EN) is generated to enable a write operation to the memory cell. At 854, the enable SFQ pulse is provided on an enable input (e.g., the enable input 52) of a Josephson D-gate circuit (e.g., the Josephson D-gate circuit 50) associated with the memory cell. The Josephson D-gate circuit can include a bi-stable loop (e.g., the bi-stable loop 60) having a bi-stable current (e.g., the bi-stable current $\pm\Phi/2$). At 856, a data SFQ pulse (e.g., the data signal DT) is provided on a data input (e.g., the data input 54) of the Josephson D-gate circuit to set the bi-stable current in a first direction (e.g., the second bi-stable current $\Phi/2$) associated with a first data state in response to the enable SFQ pulse, or is not provided the data SFQ pulse on the data input of the Josephson D-gate circuit to set the bi-stable current in a second direction (e.g., the first bi-stable current $-\Phi/2$) opposite the first direction associated with a second data state in response to the enable SFQ pulse.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconductive gate system comprising:
a Josephson D-gate circuit comprising a plurality of Josephson junctions and a bi-stable loop, the Josephson D-gate circuit being configured to set a bi-stable current in the bi-stable loop in a first direction by triggering a first portion of the plurality of Josephson junctions in response to an enable single flux quantum (SFQ) pulse provided on an enable input and an absence of a data SFQ pulse on a data input to store a digital state of the Josephson junction as a first data state, and to set the bi-stable current in the bi-stable loop in a second direction opposite the first direction by triggering a second portion of the plurality of Josephson junctions in response to the enable SQF provided on the enable input and a presence of a data SFQ pulse provided on the data input to store the digital state of the Josephson junction as a second data state, the digital state being provided at an output; and
a readout circuit coupled to the output and being configured to reproduce the digital state as an output signal.

2. The system of claim 1, wherein the plurality of Josephson junctions of the Josephson D-gate circuit comprises a first Josephson junction associated with the enable input and a second Josephson junction associated with the data input, wherein the digital state corresponds to a superconducting phase associated with the first Josephson junction.

3. The system of claim 2,
wherein the plurality of Josephson junctions of the Josephson D-gate circuit further comprises:
a third Josephson junction interconnecting the enable input and the first Josephson junction, wherein the output is coupled to a node interconnecting the first and third Josephson junctions;
a fourth Josephson junction interconnecting the data input and the second Josephson junction;
wherein the Josephson D-gate circuit further comprises:
a first bias transformer interconnecting the first and second Josephson junctions and being configured to induce a bias in the bi-stable loop in response to a bias current; and
a second bias transformer coupled to a node interconnecting the second and fourth Josephson junctions and being configured to induce a bias in the fourth Josephson junction in response to the bias current.

4. The system of claim 2,
wherein the plurality of Josephson junctions of the Josephson D-gate circuit further comprises: a third Josephson junction interconnecting the enable input and the first Josephson junction, wherein the output is coupled to a node interconnecting the first and third Josephson junctions;
wherein the Josephson D-gate circuit further comprises:
an inductor interconnecting the data input and the second Josephson junction; and
a bias transformer interconnecting the first and the second Josephson junctions and being configured to induce a bias in the bi-stable loop in response to a bias current.

5. The system of claim 1,
wherein the bi-stable loop is configured to conduct a bi-stable current in the first direction that is indicative of the first data state and in the second direction that is indicative of the second data state,
wherein the first and the second portion of the plurality of the Josephson junctions are configured to sequentially trigger in response to enable data on the enable input and input data on the data input to set the direction of the bi-stable current between the first direction and the second direction during a write operation.

6. The system of claim 1, wherein the Josephson D-gate circuit is configured to maintain the stored digital state in response to an absence of the enable SFQ pulse.

7. The system of claim 1, wherein the Josephson D-gate circuit is configured to store the second data state in response to the data SFQ pulse being time-delayed relative to the enable SFQ pulse.

8. The system of claim 7, wherein the Josephson D-gate circuit comprises a reciprocal quantum logic (RQL) bias architecture, wherein the time-delay comprises a positive SFQ pulse provided on the data input precedes a negative SFQ pulse provided on the enable input.

9. A memory cell comprising the superconductive gate system of claim 1, the memory cell further comprising:
- a first interconnect that couples the enable input to a word-line and is configured to provide the enable SFQ pulse based on a word-write signal that propagates on the word-line; and
- a second interconnect that couples the data input to a bit-line and is configured to provide the data SFQ pulse based on a bit-write signal that propagates on the bit-line.

10. The memory cell of claim 9, wherein the word-write signal and the bit-write signal are each configured as digital signals, wherein the first interconnect is configured as a passive interconnect to provide the enable SFQ pulse in response to a first binary state of the word-write signal, and wherein the second interconnect is configured as a passive interconnect to provide the data SFQ pulse in response to a first binary state of the bit-write signal.

11. A superconductive memory system comprising a plurality of memory cells of claim 9 arranged in an array of at least one row and at least one column, wherein the word-line is one of a respective at least one word-line configured to provide one of a respective at least one word-write signal to select a respective one of the at least one row during a data write operation, and wherein the bit-line is one of a respective at least one bit-line configured to provide one of a respective at least one bit-write signal to write the digital state into the bi-stable loop associated with each memory cell of the respective selected one of the at least one row.

12. A method for writing a digital state as one of a first data state and a second data state into a memory cell, the method comprising:
- generating an enable single flux quantum (SFQ) pulse to enable a write operation to the memory cell;
- providing the enable SFQ pulse on an enable input of a Josephson D-gate circuit associated with the memory cell, the Josephson D-gate circuit comprising a bi-stable loop having a bi-stable current and a plurality of Josephson junctions;
- setting a bi-stable current in the bi-stable loop in a first direction by triggering a first portion of the plurality of Josephson junctions in response to the enable SFQ pulse on the enable input and an absence of a data SFQ pulse on a data input of the Josephson D-gate circuit to store the first data state; and
- setting the bi-stable current in the bi-stable loop in a second direction opposite the first direction by triggering a second portion of the plurality of Josephson junctions in response to the enable SFQ pulse on the enable input and a presence of the data SFQ pulse on the data input of the Josephson D-gate circuit to store the second data state.

13. The method of claim 12,
wherein the data SFQ pulse is provided sequentially on the data input to sequentially trigger the first portion of the plurality of the Josephson junctions in response to the data SFQ pulse and the enable SFQ pulse to set the bi-stable current in the first direction indicative of the first data state, and
wherein the absence of the data SFQ pulse comprises providing no data SFQ pulse on the data input to sequentially trigger the second portion of the plurality of the Josephson junctions in response to the enable SFQ pulse to set the bi-stable current in the second direction indicative of the second data state.

14. The method of claim 12, wherein the data SFQ pulse is provided in a time-delay manner with respect to the enable SFQ pulse, such that a positive data SFQ pulse precedes a negative enable SFQ pulse.

15. The method of claim 12,
wherein generating the enable SFQ pulse comprises providing the enable SFQ pulse to enable a write operation to each of the memory cell and a plurality of additional memory cells in a row that are coupled to a word-line,
wherein the absence of the data SFQ pulse and the presence of the data SFQ pulse-comprises providing one of the data SFQ pulse and no data SFQ pulse to each of the memory cell and a plurality of additional memory cells in a column that are coupled to a bit-line to set the bi-stable current in one of the first direction and the second direction, respectively.

16. A superconductive memory system comprising a plurality of memory cells arranged in an array of rows and columns, each of the plurality of memory cells comprising:
- a first interconnect that couples a word-line associated with a given one of the rows to an enable input of the respective one of the plurality of memory cells, the first interconnect being configured to provide an enable single flux quantum (SFQ) pulse on the enable input;
- a second interconnect that couples a bit-line associated with the given one of the columns to a data input of the respective one of the plurality of memory cells, the second interconnect being configured to provide a data SFQ pulse on the data input; and
- a Josephson D-gate circuit comprising a plurality of Josephson junctions and a bi-stable loop, the Josephson D-gate circuit being configured to set a bi-stable current in the bi-stable loop in a first direction by triggering a first portion of the plurality of Josephson junctions in response to the enable SFQ pulse provided on the enable input and an absence of the data SFQ pulse on the data input to store a digital state of the Josephson junction as a first data state and to set the bi-stable current in the bi-stable loop in a second direction opposite the first direction by triggering a second portion of the plurality of Josephson junctions in response to the enable SQF provided on the enable input and a presence of the data SFQ pulse provided on the data input to store the digital state of the Josephson junction as a second data state.

17. The system of claim 16,
wherein the bi-stable loop is configured to conduct a bi-stable current in the first direction that is indicative of the first data state and in the second direction that is indicative of the second data state,
wherein the first and the second portion of the plurality of the Josephson junctions are configured to sequentially trigger in response to enable data on the enable input and input data on the data input to set the direction of the bi-stable current between the first direction and the second direction during a write operation.

18. The system of claim 16, wherein the plurality of Josephson junctions of the Josephson D-gate circuit comprises a first Josephson junction associated with the enable input and a second Josephson junction associated with the data input, wherein the digital state corresponds to a superconducting phase associated with the first Josephson junction.

19. The system of claim 18,
wherein the plurality of Josephson junctions of the Josephson D-gate circuit further comprises:

a third Josephson junction interconnecting the enable input and the first Josephson junction, wherein the output is coupled to a node interconnecting the first and third Josephson junctions;

a fourth Josephson junction interconnecting the data input and the second Josephson junction;

wherein the Josephson D-gate circuit further comprises:

a first bias transistor interconnecting the first and second Josephson junctions and being configured to induce a bias in the bi-stable loop in response to a bias current; and a second bias transformer coupled to a node interconnecting the second and fourth Josephson junctions and being configured to induce a bias in the fourth Josephson junction in response to the bias current.

20. The system of claim 18, wherein the plurality of Josephson junctions of the Josephson D-gate circuit further comprises: a third Josephson junction interconnecting the enable input and the first Josephson junction, wherein the output is coupled to a node interconnecting the first and third Josephson junctions;

wherein the Josephson D-gate circuit further comprises:

an inductor interconnecting the data input and the second Josephson junction; and a bias transformer interconnecting the first and second Josephson junctions and being configured to induce a bias in the bi-stable loop in response to a bias current.

\* \* \* \* \*